United States Patent
Park et al.

(10) Patent No.: US 9,123,474 B2
(45) Date of Patent: Sep. 1, 2015

(54) MULTILAYERED CERAMIC CAPACITOR AND MOUNTING BOARD THEREFOR

(71) Applicant: SAMSUNG ELECTRO-MECHANICS CO., LTD., Suwon, Gyunggi-do (KR)

(72) Inventors: Min Cheol Park, Gyunggi-do (KR); Heung Kil Park, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 216 days.

(21) Appl. No.: 13/949,672

(22) Filed: Jul. 24, 2013

(65) Prior Publication Data

US 2014/0311784 A1 Oct. 23, 2014

(30) Foreign Application Priority Data

Apr. 22, 2013 (KR) .................. 10-2013-0044157

(51) Int. Cl.
*H01G 4/228* (2006.01)
*H01G 4/38* (2006.01)
*H05K 1/18* (2006.01)
*H01G 4/30* (2006.01)
*H01G 4/232* (2006.01)

(52) U.S. Cl.
CPC .............. *H01G 4/385* (2013.01); *H01G 4/232* (2013.01); *H01G 4/30* (2013.01); *H05K 1/181* (2013.01)

(58) Field of Classification Search
USPC ............... 361/306.3, 301.2, 301.4, 303–305, 361/306.1, 308.1, 321.1, 321.2
See application file for complete search history.

(56) References Cited

U.S. PATENT DOCUMENTS

| | | | | |
|---|---|---|---|---|
| 6,515,842 | B1 * | 2/2003 | Hayworth et al. | 361/303 |
| 6,606,237 | B1 * | 8/2003 | Naito et al. | 361/306.3 |
| 7,050,288 | B2 * | 5/2006 | Ahiko et al. | 361/303 |
| 7,324,327 | B2 * | 1/2008 | Togashi | 361/321.2 |
| 7,936,554 | B2 * | 5/2011 | Itamura et al. | 361/303 |
| 8,194,389 | B2 * | 6/2012 | Lee et al. | 361/303 |
| 2009/0161228 | A1 | 6/2009 | Lee | |

FOREIGN PATENT DOCUMENTS

JP 2010-068012 A 3/2010
JP 2010-098254 A 4/2010

* cited by examiner

*Primary Examiner* — Nguyen T Ha
(74) *Attorney, Agent, or Firm* — McDermott Will & Emery LLP

(57) ABSTRACT

There is provided a multilayer ceramic capacitor including a ceramic body, first to third capacitor parts, first and second internal connection conductors, and first to fourth external electrodes, wherein the first capacitor part is connected in series with the second internal connection conductor, and the second capacitor part is connected in series with the first internal connection conductor.

23 Claims, 6 Drawing Sheets

MULTILAYERED CERAMIC CAPACITOR AND MOUNTING BOARD THEREFOR

CROSS-REFERENCE TO RELATED APPLICATIONS

This application claims the priority of Korean Patent Application No. 10-2013-0044157 filed on Apr. 22, 2013, in the Korean Intellectual Property Office, the disclosure of which is incorporated herein by reference.

BACKGROUND OF THE INVENTION

1. Field of the Invention

The present invention relates to a multilayer ceramic capacitor and a mounting board therefor.

2. Description of the Related Art

A multilayer ceramic capacitor, a multilayer chip electronic component, is a chip-shaped condenser mounted on the printed circuit boards of various electronic products such as display devices, liquid crystal displays (LCDs), plasma display panels (PDPs) and the like, for example, as well as computers, smartphones, mobile phones, and the like, to serve to charge and discharge electricity therein.

Since such a multilayer ceramic capacitor (MLCC) has advantages such as a small size, high capacitance, ease of mounting, or the like, such a multilayer ceramic capacitor may be used as a component in various electronic devices.

The multilayer ceramic capacitor may have a structure in which a plurality of dielectric layers and internal electrodes having different polarities are alternately stacked while being interposed between the dielectric layers.

In particular, in a power supply device for a central processing unit (CPU) such as a computer, or the like, voltage noise may be generated due to rapid changes in a level of a load current during a process of providing low level voltage.

Therefore, a multilayer capacitor has been widely used as a decoupling capacitor for suppressing voltage noise in such a power supply device.

Demands have been made for a decoupling multilayer ceramic capacitor to have low equivalent series inductance (ESL) in accordance with an increase in an operational frequency, and research into technologies for decreasing ESL have been, actively undertaken.

In addition, in order to supply power more stably, demands have been made for the decoupling multilayer ceramic capacitor to have controllable equivalent series resistance (ESR) characteristics.

In the case in which the multilayer ceramic capacitor has a ESR level lower than a desired ESR level, ESL of the multilayer ceramic capacitor and an impedance peak in a parallel resonance frequency generated due to plane capacitance of a microprocessor package may be increased, while impedance in a series resonance frequency of the multilayer ceramic capacitor may be extremely decreased.

Therefore, ESR characteristics of the decoupling multilayer ceramic capacitor may be easily controlled and improved, such that flat impedance characteristics in a power distribution network may be implemented by a user.

In connection with the controlling of ESR, using a material having high electrical resistance for an external electrode and an internal electrode may be considered. Using a material having high electrical resistance may be advantageous, in that high ESR characteristics are provided while a low ESL structure is maintained, as in the case of the related art.

However, in the case of using a material having a high degree of electrical resistance for an external electrode, a localized heat spot caused by a current channeling phenomenon due to a pin hole is generated. In addition, in the case of using a material having a high degree of electrical resistance for an internal electrode, an internal electrode material needs to be continuously changed so as to match a ceramic material according to high capacitance.

Therefore, since the method of controlling ESR according to the related art has disadvantages as described above, research into a multilayer ceramic capacitor allowing for control of ESR remains necessary.

In addition, with a rapid development of a mobile terminal such as a tablet PC, an ultrabook, or the like, in recent years, a micro processor has been converted to a high-integration product having a small size.

Therefore, since an area of a printed circuit board is decreased and a space for mounting a decoupling capacitor therein is limited, a multilayer ceramic capacitor capable of overcoming the disadvantages has been demanded.

RELATED ART DOCUMENT (Patent Document 1) Japanese Patent Laid-open Publication No. 2010-098254

SUMMARY OF THE INVENTION

An aspect of the present invention provides a multilayer ceramic capacitor and a mounting board therefor.

According to an aspect of the present invention, there is provided a multilayer ceramic capacitor including: a ceramic body including a plurality of dielectric layers and having first and second main surfaces facing each other, first and second side surfaces facing each other, and first and second end surfaces facing each other; a first capacitor part formed in the ceramic body and including a first internal electrode having a lead portion exposed to the first side surface and a second internal electrode having a lead portion exposed to the second side surface, a second capacitor part including a third internal electrode having a lead portion exposed to the first side surface and spaced apart from the lead portion of the first internal electrode and a fourth internal electrode having a lead portion exposed to the second side surface and spaced apart from the lead portion of the second internal electrode, and a third capacitor part formed by an overlap region between the first and fourth internal electrodes; first and second internal connection conductors formed in the ceramic body and exposed to the first and second side surfaces; and first to fourth external electrodes formed on the first and second side surfaces of the ceramic body and electrically connected to the first to fourth internal electrodes and the first and second internal connection conductors, wherein the first capacitor part is connected in series with the second internal connection conductor, and the second capacitor part is connected in series with the first internal connection conductor.

The first and second external electrodes may be disposed to be spaced apart from each other on the first side surface of the ceramic body, and the third and fourth external electrodes may be disposed to be spaced apart from each other on the second side surface of the ceramic body.

A mounting surface of the multilayer ceramic capacitor may be the second side surface of the ceramic body.

The lead portion of the first internal electrode may be connected to the first external electrode, the lead portion of the second internal electrode may be connected to the third external electrode, the lead portion of the third internal electrode may be connected to the second external electrode, and the lead portion of the fourth internal electrode may be connected to the fourth external electrode.

The first internal connection conductor may be connected to the second internal electrode through the third external electrode and connected to the third internal electrode through the second external electrode.

The second internal connection conductor may be connected to the first internal electrode through the first external electrode and connected to the fourth internal electrode through the fourth external electrode.

The first and third internal electrodes may be formed to be spaced apart from each other on a single layer in a cross-section of the ceramic body in a length-width direction, and the second and fourth internal electrodes may be formed to be spaced apart from each other on another single layer in the cross-section of the ceramic body in the length-width direction.

The third capacitor part may be connected to the first and fourth external electrodes.

When lengths of the first and fourth internal electrodes in a length direction of the ceramic body are defined by L1 and L2, respectively, and a length of the third capacitor part corresponding to the overlap region is defined by L3, $L3/L1 \leq 0.05$ or $L3/L2 \leq 0.05$ may be satisfied.

When lengths of the first and fourth internal electrodes in a length direction of the ceramic body are defined by L1 and L2, respectively, and a length of the third capacitor part corresponding to the overlap region is defined by L3, $0.001 \leq L3/L1 \leq 0.01$ or $0.001 \leq L3/L2 \leq 0.01$ may be satisfied.

The second internal connection conductor may be connected to the second internal electrode through the third external electrode and connected to the third internal electrode through the second external electrode.

Internal end portions of the first and fourth internal electrodes in a length direction of the ceramic body may coincide with each other when they are viewed in a stacking direction of the ceramic body.

According to another aspect of the present invention, there is provided a multilayer ceramic capacitor including: a ceramic body including a plurality of dielectric layers and having first and second main surfaces facing each other, first and second side surfaces facing each other, and first and second end surfaces facing each other; first, third, fifth, and seventh internal electrodes exposed to the first side surface in the ceramic body and formed to be spaced apart from one another on a single layer and second, fourth, sixth, and eighth internal electrodes exposed to the second side surface and formed to be spaced apart from one another on another single layer, in a cross-section of the ceramic body in a length-width direction; first to fourth internal connection conductors formed in the ceramic body and exposed to the first and second side surfaces; and first to eighth external electrodes formed on the first and second side surfaces of the ceramic body and electrically connected to the first to eighth internal electrodes and the first to fourth internal connection conductors, wherein the first and second internal electrodes, the third and fourth internal electrodes, the fifth and sixth internal electrodes, and the seventh and eighth internal electrodes form first, second, third, and fourth capacitor parts, respectively, a fifth capacitor part is formed by an overlap region between the first and fourth internal electrode, and a sixth capacitor part is formed by an overlapped portion between the fifth and eighth internal electrodes, the first and second capacitor parts being connected in series with the first and second internal connection conductors, respectively, and the third and fourth capacitor parts being connected in series with the third and fourth internal connection conductors, respectively.

The first to fourth external electrodes may be disposed to be spaced apart from one another on the first side surface of the ceramic body, and the fifth to eighth external electrodes may be disposed to be spaced apart from one another on the second side surface of the ceramic body.

A mounting surface of the multilayer ceramic capacitor may be the second side surface of the ceramic body.

The first, third, fifth, seventh, second, fourth, sixth, and eighth internal electrodes may be connected to the first to eighth external electrodes, respectively.

The first internal connection conductor may be connected to the first internal electrode through the first external electrode and connected to the fourth internal electrode through the sixth external electrode.

The second internal connection conductor may be connected to the second internal electrode through the fifth external electrode and connected to the third internal electrode through the second external electrode.

The third internal connection conductor may be connected to the fifth internal electrode through the third external electrode and connected to the eighth internal electrode through the eighth external electrode.

The fourth internal connection conductor may be connected to the sixth internal electrode through the seventh external electrode and connected to the seventh internal electrode through the fourth external electrode.

The fifth capacitor part may be connected to the first and sixth external electrodes.

The sixth capacitor part may be connected to the third and eighth external electrodes.

Internal end portions of the first and fourth internal electrodes in the length direction of the ceramic body, and internal end portions of the fifth and eighth internal electrodes in the length direction of the ceramic body may coincide with each other, respectively, when they are viewed in a stacking direction of the ceramic body.

According to another aspect of the present invention, there is provided a mounting board for a multilayer ceramic capacitor including: a printed circuit board having first and second electrode pads thereon; and the multilayer ceramic capacitor as described above mounted on the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
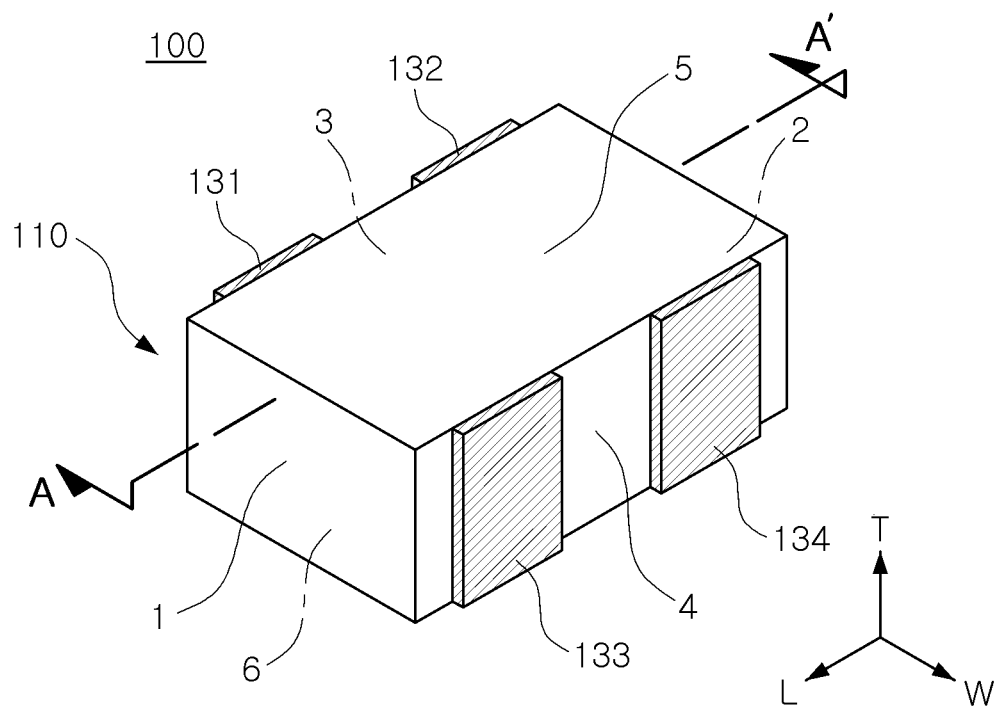
FIG. 1 is a perspective view of a multilayer ceramic capacitor according to an embodiment of the present invention.

Embodiments of the present invention will now be described in detail with reference to the accompanying drawings.

The embodiments of the present invention may be modified in many different forms and the scope of the invention should not be limited to the embodiments set forth herein.

Rather, these embodiments are provided so that this disclosure will be thorough and complete, and will fully convey the concept of the invention to those skilled in the art.

In the drawings, the shapes and dimensions of the elements may be exaggerated for clarity.

In addition, components having like functions are denoted by like reference numerals throughout the drawings of each embodiment.

When defining each direction of a hexahedron in order to clearly describe the embodiment of the present invention, L, W and T shown in a drawing refer to a length direction, a width direction, and a thickness direction, respectively. Here, a thickness direction may be used as the same meaning as a direction in which the dielectric layers are stacked (that is, a stacking direction).

Multilayer Ceramic Capacitor

Hereinafter, embodiments of the present invention will be described in detail with reference to the accompanying drawings.

FIG. 1 is a perspective view of a multilayer ceramic capacitor according to an embodiment of the present invention.

Figure 2:
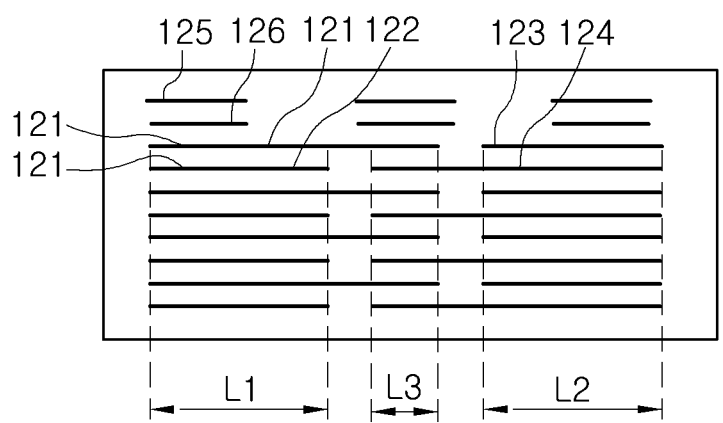
FIG. 2 is a cross-sectional view taken along line A-A' of FIG. 1.

FIG. 2 is a cross-sectional view taken along line A-A' of FIG. 1.

Figure 3:
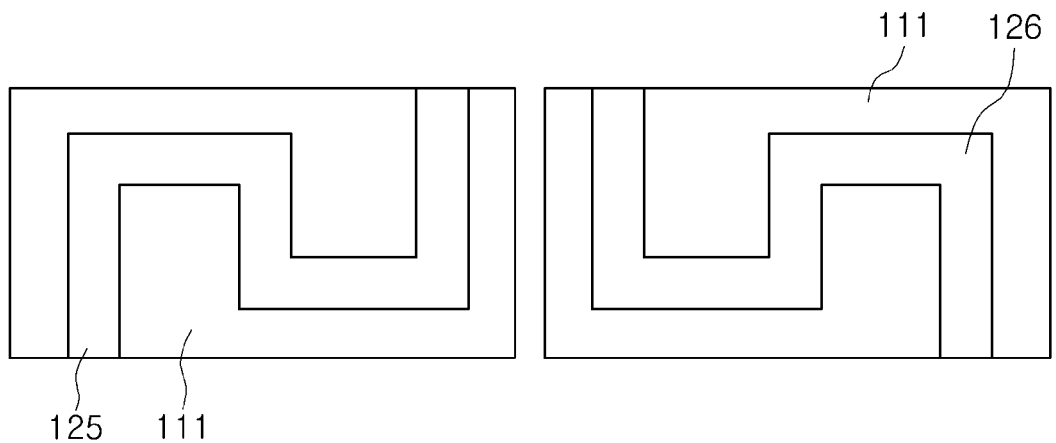
FIG. 3 is a plan view showing first and second internal connection conductors employable in the multilayer ceramic capacitor shown in FIG. 1.

FIG. 3 is a plan view showing first and second internal connection conductors employable in the multilayer ceramic capacitor shown in FIG. 1.

Figure 4:
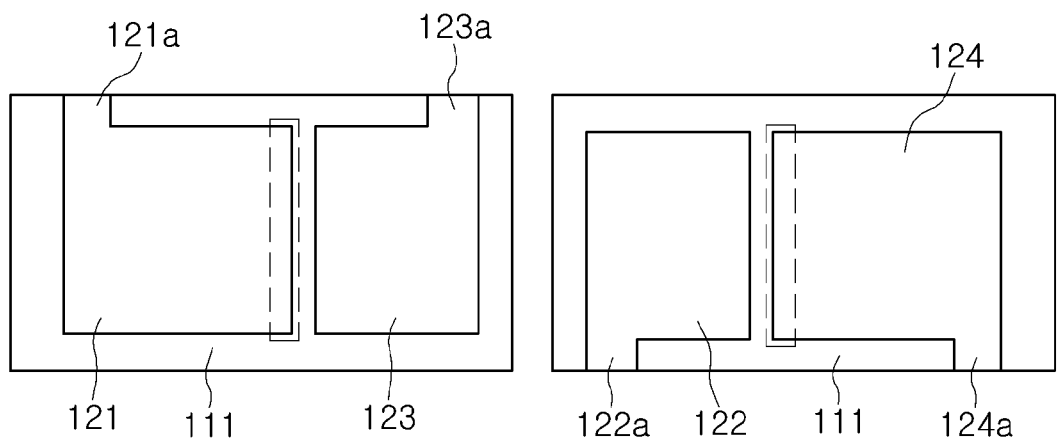
FIG. 4 is a plan view showing first to fourth internal electrodes able to be used with the first and second internal connection conductors shown in FIG. 3.

FIG. 4 is a plan view showing first to fourth internal electrodes able to be used with the first and second internal connection conductors shown in FIG. 3.

Referring to FIGS. 1 to 4, a multilayer ceramic capacitor 100 according to the embodiment of the present invention may include a ceramic body 110 including a plurality of dielectric layers 111, and having first and second main surfaces facing each other, first and second side surfaces facing each other, and first and second end surfaces facing each other.

According to the embodiment of the present invention, the ceramic body 110 may have a first main surface 5 and a second main surface 6 facing each other, a first side surface 3 and a second side surface 4 connecting the first main surface and the second main surface to each other, and a first end surface 1 and a second end surface 2.

The ceramic body 110 is not specifically limited in view of a shape, but may have a hexahedral shape as shown in drawings.

The plurality of dielectric layers 111 configuring the ceramic body 110 may be in a sintered state and boundaries between adjacent dielectric layers 111 may be integrated such that they may not be readily discernible.

The dielectric layer 111 may be formed by sintering a ceramic green sheet containing a ceramic powder, an organic solvent, and an organic binder. As the ceramic powder, a high k material, a barium titanate ($BaTiO_3$) based material, a strontium titanate ($SrTiO_3$) based material, or the like, may be used. However, the ceramic powder is not limited thereto.

The multilayer ceramic capacitor 100 may include a first capacitor part formed in the ceramic body 110 and including a first internal electrode 121 having a lead portion 121a exposed to the first side surface 3 and a second internal electrode 122 having a lead portion 122a exposed to the second side surface 4, a second capacitor part including a third internal electrode 123 having a lead portion 123a exposed to the first side surface 3 and spaced apart from the lead portion 121a of the first internal electrode 121 and a fourth internal electrode 124 having a lead portion 124a exposed to the second side surface 4 and spaced apart from the lead portion 122a of the second internal electrode, and a third capacitor part formed by an overlap region between the first and fourth internal electrodes 121 and 124.

According to the embodiment of the present invention, the first to fourth internal electrodes 121, 122, 123, and 124 may be formed of a conductive paste containing a conductive metal.

The conductive metal may be nickel (Ni), copper (Cu), palladium (Pd), or an alloy thereof, but is not limited thereto.

An internal electrode layer may be printed on the ceramic green sheet configuring the dielectric layer by using the conductive paste through a printing method such as a screen printing method or a gravure printing method.

Several layers of the ceramic green sheet having the internal electrode layer printed thereon may be alternately stacked and sintered to thereby form the ceramic body.

In addition, the multilayer ceramic capacitor 100 may include first and second internal connection conductors 125 and 126 formed in the ceramic body 110 and exposed to the first and second side surfaces 3 and 4.

The first and second internal connection conductors 125 and 126 are not specifically limited, and for example, may be formed of a conductive paste containing a conductive metal, similarly to the first to fourth internal electrodes 121, 122, 123, and 124.

The conductive metal may be nickel (Ni), copper (Cu), palladium (Pd), or an alloy thereof, but is not limited thereto.

In addition, the multilayer ceramic capacitor 100 may include first to fourth external electrodes 131 to 134 formed on the first and second side surfaces 3 and 4 of the ceramic body 110 and electrically connected to the first to fourth internal electrodes 121 to 124 and the first and second internal connection conductors 125 and 126.

The first and second external electrodes 131 and 132 may be disposed to be spaced apart from each other on the first side surface 3 of the ceramic body 110, and the third and fourth external electrodes 133 and 134 may be disposed to be spaced apart from each other on the second side surface 4 of the ceramic body.

According to the embodiment of the present invention, a mounting surface of the multilayer ceramic capacitor 100 may be the second side surface 4 of the ceramic body 110.

That is, the multilayer ceramic capacitor according to the embodiment of the present invention may be perpendicularly mounted with respect to the mounting board, but is not limited thereto. The multilayer ceramic capacitor may be mounted in various manners.

Therefore, the third and fourth external electrodes 133 and 134 may contact first and second electrode pads on a mounting board for the multilayer ceramic capacitor, to be described below.

According to the embodiment of the present invention, it may be understood that two external electrodes 131 and 132 except for the third and fourth external electrodes 133 and 134 used as external terminals for connection with a power line are used as external electrodes for controlling ESR.

However, since the third and fourth external electrodes used as the external terminals may be optionally selected so as to be appropriate for desired ESR characteristics, the third and fourth external electrodes are not particularly limited.

The first and second external electrodes 131 and 132 for controlling ESR may be non-contact terminals that are not connected to the power line as described above and may be positioned on an upper surface of the multilayer ceramic capacitor when the multilayer ceramic capacitor is mounted on the mounting board.

That is, according to the embodiment of the present invention, since the first and second external electrodes 131 and 132, the non-contact terminals, are formed on the upper surface of the multilayer ceramic capacitor, rather than being formed on a side surface of the multilayer ceramic capacitor, the downsizing of a product may not be hindered by the non-contact terminals, which may be advantageous for miniaturization of the product.

The first to fourth external electrodes 131 to 134 may be formed of a conductive paste including a conductive metal.

The conductive metal may be nickel (Ni), copper (Cu), tin (Sn), or an alloy thereof, but is not limited thereto.

The conductive paste may further include an insulating material. The insulating material may be, for example, glass, but is not limited thereto.

A method of forming the first to fourth external electrodes 131 to 134 is not particularly limited. That is, the first to fourth external electrodes 131 to 134 may be formed by dipping the ceramic body or be formed by other methods such as a plating method and the like.

The multilayer ceramic capacitor 100 is a four-terminal capacitor having four external electrodes, but the present invention is not limited thereto.

Hereinafter, configurations of the internal electrodes 121, 122, 123, and 124, the first and second internal connection conductors 125 and 126, and the external electrodes 131, 132, 133, and 134 in the multilayer ceramic capacitor 100 according to the embodiment of the present invention will be described in detail with reference to FIGS. 2 to 4.

The first capacitor part may be formed in the ceramic body 110 and include the first internal electrode 121 having the lead portion 121a exposed to the first side surface 3 and the second internal electrode 122 having the lead portion 122a exposed to the second side surface 4 to form capacitance.

In addition, the second capacitor part may include the third internal electrode 123 having the lead portion 123a exposed to the first side surface 3 and spaced apart from the lead portion 121a of the first internal electrode and the fourth internal electrode 124 having the lead portion 124a exposed to the second side surface 4 and spaced apart from the lead portion 122a of the second internal electrode to form capacitance.

Further, the third capacitor part may be formed by an overlap region between the first and fourth internal electrodes 121 and 124.

The lead portion 121a of the first internal electrode may be connected to the first external electrode 131, the lead portion 122a of the second internal electrode may be connected to the third external electrode 133, the lead portion 123a of the third internal electrode may be connected to the second external electrode 132, and the lead portion 124a of the fourth internal electrode may be connected to the fourth external electrode 134, but the present invention is not limited thereto.

The first and second capacitor parts may be disposed in the ceramic body 110 without particular limitations, and in order to implement a target capacitance value, a plurality of first and second capacitor parts may be stacked.

According to the embodiment of the present invention, the first and second capacitor parts may be connected in parallel in the multilayer ceramic capacitor 100.

According to the embodiment of the present invention, the first and third internal electrodes 121 and 123 may be formed to be spaced apart from each other on a single layer in a cross-section of the ceramic body in a length-width direction, and the second and fourth internal electrodes 122 and 124 may be formed to be spaced apart from each other on another single layer in the cross-section of the ceramic body in the length-width direction.

The first to fourth internal electrodes 121, 122, 123, and 124 and the first and second internal connection conductors 125 and 126 may be alternately disposed with the dielectric layers 111 interposed therebetween.

Each of the first and second internal connection conductors 125 and 126 may be shown in FIG. 3, but a plurality of internal connection conductors having at least one polarity may be provided.

Similarly, each of the first to fourth internal electrodes 121, 122, 123, and 124 may be shown in FIG. 4, but a plurality of internal electrodes may be actually provided.

Meanwhile, the internal electrodes and the internal connection conductors may be stacked in a sequence shown in FIGS. 3 and 4, but may be stacked in various types of sequence as needed.

In particular, desired ESR characteristics may be precisely controlled by changing a width, a length, and the number of layers of the first and second internal connection conductors 125 and 126.

The multilayer ceramic capacitor according to the embodiment of the present invention may have the overlap region between the first and fourth internal electrodes 121 and 124 and further include the third capacitor part formed by the overlap region, unlike a general multilayer ceramic capacitor.

The third capacitor part may be implemented by setting lengths of the internal electrodes and the length of the capacitor such that the first internal electrode 121 formed on a single layer and the fourth internal electrode formed on another single layer are overlapped with each other in the cross-section of the ceramic body in the length-width direction.

Since the third capacitor part is formed in the overlap region between the first and fourth internal electrodes 121 and 124, the third capacitor part may form capacitance in the region different from those of the first and second capacitor parts.

As described above, the multilayer ceramic capacitor according to the embodiment of the present invention includes the third capacitor part, such that the multilayer ceramic capacitor may have a lower level of ESL in a high frequency band while maintaining a high level of ESR. Therefore, in view of the overall impedance characteristics, a low level of impedance may be implemented in a widened frequency band.

The third capacitor part may be connected to the first and fourth external electrodes 131 and 134.

According to the embodiment of the present invention, when lengths of the first and fourth internal electrodes 121 and 124 in a length direction of the ceramic body 110 are defined by L1 and L2, respectively, and a length of the third capacitor part corresponding to the overlap region in the length direction of the ceramic body 110 is defined by L3, L3/L1≤0.05 or L3/L2≤0.05 may be satisfied.

Since the multilayer ceramic capacitor may have a lower level of ESL in a high frequency band while maintaining a high level of ESR by controlling the lengths L1 and L2 of the first and fourth internal electrodes 121 and 124 in the length direction of the ceramic body 110 and the length L3 of the third capacitor part corresponding to the overlap region in the length direction of the ceramic body 110 such that L3/L1≤0.05 or L3/L2≤0.05 is satisfied, low impedance may be implemented in a wider frequency band in view of the overall impedance characteristics.

In the case in which L3/L1 or L3/L2 is greater than 0.05, high ESR characteristics are lost, such that it may be difficult to implement low impedance in the wider frequency band.

Although the case in which L3/L1≤0.05 or L3/L2≤0.05 is satisfied is described herein, both of L3/L1≤0.05 and L3/L2≤0.05 may be satisfied.

In the embodiment of the present invention, as another example, in the length direction of the ceramic body 110, internal end portions of the first and fourth internal electrodes 121 and 124 may coincide with each other when they are viewed in a stacking direction of the ceramic body 110.

In the case in which the internal end portions of the first and fourth internal electrodes 121 and 124 coincide with each other as described above, the third capacitor part may also be formed, such that the multilayer ceramic capacitor may have lower ESL in a high frequency band while maintaining high ESR. Therefore, in view of the overall impedance characteristics, low impedance may be implemented in a wider frequency band.

According to the embodiment of the present invention, when the lengths of the first and fourth internal electrodes 121 and 124 in the length direction of the ceramic body 110 are defined by L1 and L2, respectively, and the length of the third capacitor part corresponding to the overlap region in the length direction of the ceramic body is defined by L3, 0.001≤L3/L1≤0.01 or 0.001≤L3/L2≤0.01 may be satisfied.

Since high frequency characteristics may be improved without a decrease in an ESR region by controlling the lengths L1 and L2 of the first and fourth internal electrodes 121 and 124 in the length direction of the ceramic body 110 and the length L3 of the third capacitor part corresponding to the overlap region in the length direction of the ceramic body 110 such that 0.001≤L3/L1≤0.01 or 0.001≤L3/L2≤0.01 is satisfied, ow impedance may be more effectively implemented in a wider frequency band.

In the case in which L3/L1 or L3/L2 is greater than 0.01, the ESR region may be decreased, such that it may be difficult to implement low impedance in a wider frequency band.

Although the case in which 0.001≤L3/L1≤0.01 or 0.001≤L3/L2≤0.01 is satisfied is described herein, both of 0.001≤L3/L1≤0.01 and 0.001≤L3/L2≤0.01 may be satisfied.

According to the embodiment of the present invention, the first internal connection conductor 125 may be connected to the second internal electrode 122 through the third external electrode 133 and connected to the third internal electrode 123 through the second external electrode 132.

According to the embodiment of the present invention, the second internal connection conductor 126 may be connected to the first internal electrode 121 through the first external electrode 131 and connected to the fourth internal electrode 124 through the fourth external electrode 134.

In addition, the second internal connection conductor 126 may be connected to the second internal electrode 122 through the third external electrode 133 and connected to the third internal electrode 123 through the second external electrode 132.

Pattern shapes of the first and second internal connection conductors 125 and 126 shown in FIG. 3 are merely provided by way of example according to the embodiment of the present invention. Therefore, the internal connection conductors may have various pattern shapes in order to control the ESR.

For example, the first and second internal connection conductors 125 and 126 shown in FIG. 3 may have the same pattern shapes as those of the first to fourth internal electrodes 121, 122, 123, and 124 shown in FIG. 4.

According to the embodiment of the present invention, the ESR of the multilayer ceramic capacitor may be controlled by the first and second internal connection conductors 125 and 126.

That is, the first capacitor part including the first and second internal electrodes 121 and 122 and the second capacitor part including the third and fourth internal electrodes 123 and 124 may be connected in parallel as described below.

In addition, the third capacitor part may be connected in parallel with the first and second capacitor parts.

Further, the first capacitor part may be connected in series with the second internal connection conductor 126, and the second capacitor part may be connected in series with the first internal connection conductor 125.

Due to the connections as described above, the ESR of the multilayer ceramic capacitor may be controlled by the first and second internal connection conductors 125 and 126.

In addition, in the present embodiment, the third and fourth external electrodes 133 and 134 may be used as the external terminals for connection with the power line. For example, the third external electrode 133 may be connected to a power terminal, and the fourth external electrode 134 may be connected to a ground.

Meanwhile, the first and second external electrodes 131 and 132, two external electrodes except for the third and fourth external electrodes 133 and 134, may be used to control ESR and may be the non-contact terminals.

Figure 5:
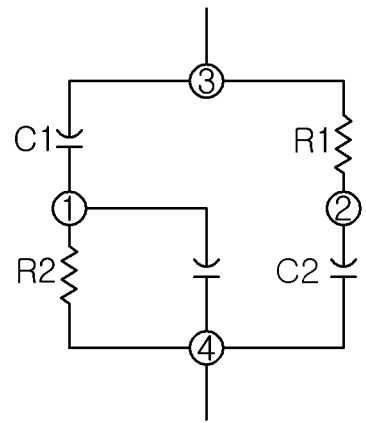
FIG. 5 is an equivalent circuit diagram of the multilayer ceramic capacitor shown in FIG. 1.

FIG. 5 is an equivalent circuit diagram of the multilayer ceramic capacitor shown in FIG. 1.

Referring to FIG. 5, the first capacitor part including the first and second internal electrodes 121 and 122 and the second capacitor part including the third and fourth internal electrodes 123 and 124 may be connected in parallel.

In addition, the third capacitor part may be connected in parallel with the first and second capacitor parts.

Further, the first capacitor part may be connected in series with the second internal connection conductor 126, and the second capacitor part may be connected in series with the first internal connection conductor 125.

As described above, the multilayer ceramic capacitor according to the embodiment of the present invention may have two types of resistors and three types of capacitor parts of which values are controlled, respectively.

The multilayer ceramic capacitor according to the embodiment of the present invention may have a structure including the internal electrodes 121, 122, 123, and 124, the internal connection conductors 125 and 126, and the external electrodes as described above, whereby a reduction in impedance and a control thereof may be facilitated within a relatively large frequency band, as compared to the case of a multilayer ceramic capacitor according to the related art, and an available mounting space and manufacturing costs may be reduced due to a decrease in components.

In addition, as the multilayer ceramic capacitor may be perpendicularly mounted with respect to the mounting board, the downsizing of a product may not be hindered by the non-contact terminals, which may be advantageous for miniaturization of the product.

Figure 6:
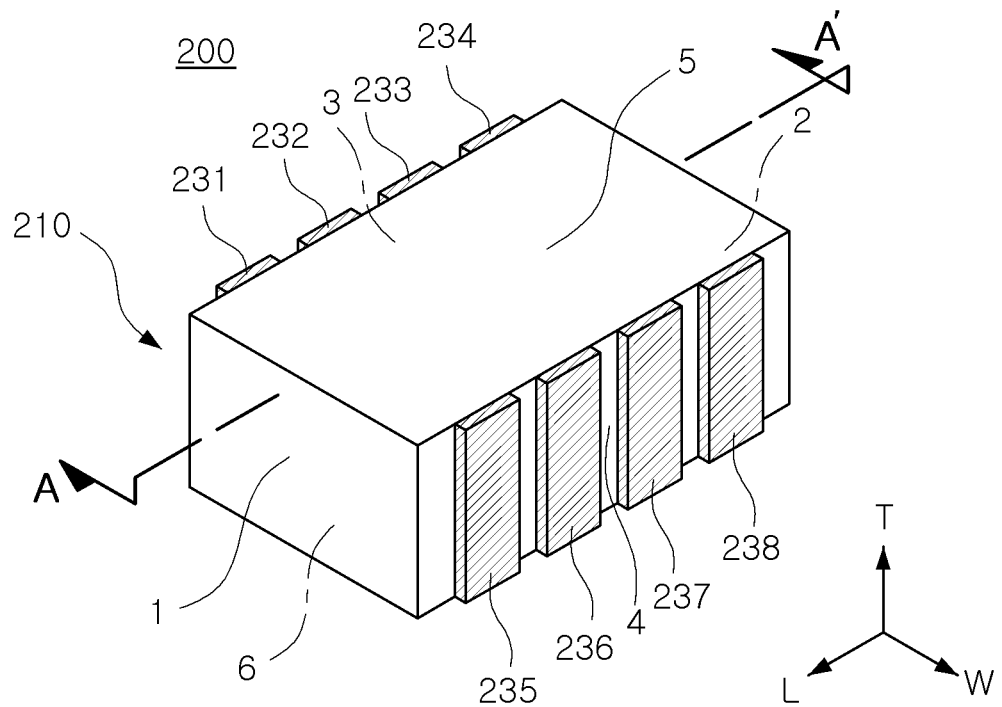
FIG. 6 is a perspective view of a multilayer ceramic capacitor according to another embodiment of the present invention.

FIG. 6 is a perspective view of a multilayer ceramic capacitor according to another embodiment of the present invention.

Figure 7:
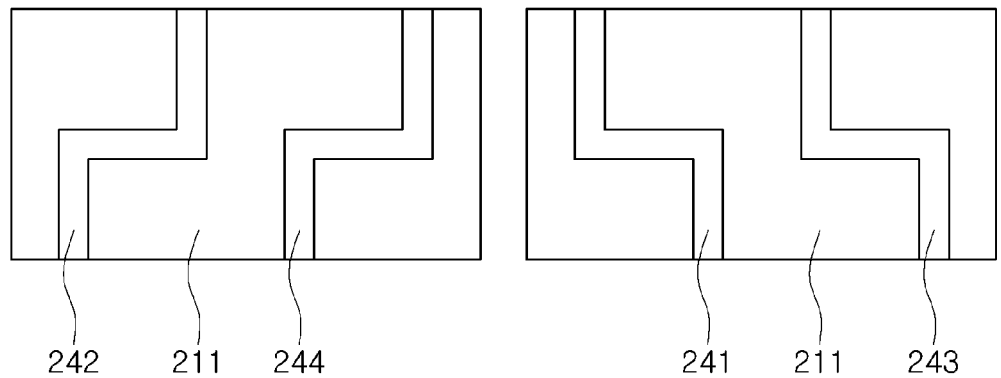
FIG. 7 is a plan view showing first to four internal connection conductors employable in the multilayer ceramic capacitor according to another embodiment of the present invention.

FIG. 7 is a plan view showing first to four internal connection conductors employable in the multilayer ceramic capacitor according to another embodiment of the present invention.

Figure 8:
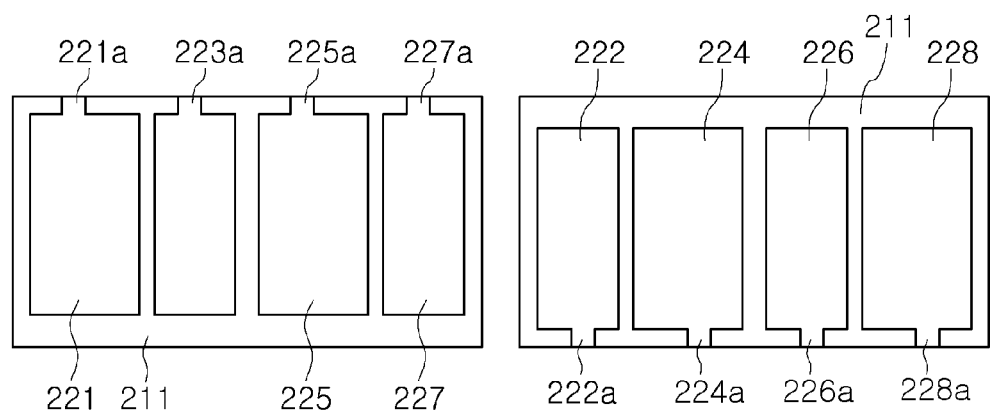
FIG. 8 is a plan view showing first to eighth internal electrodes able to be used with the first to fourth internal connection conductors shown in FIG. 7.

FIG. 8 is a plan view showing first to eighth internal electrodes able to be used with the first to fourth internal connection conductors shown in FIG. 7.

Figure 9:
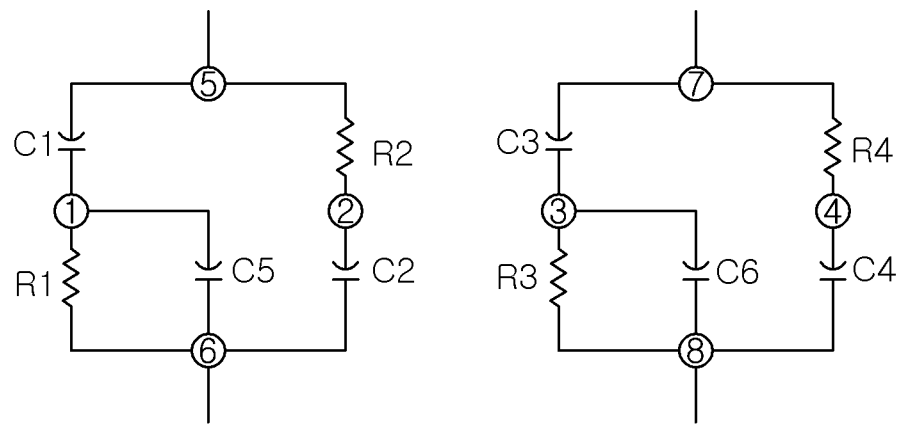
FIG. 9 is an equivalent circuit diagram of the multilayer ceramic capacitor shown in FIG. 6.

FIG. 9 is an equivalent circuit diagram of the multilayer ceramic capacitor shown in FIG. 6.

Referring to FIGS. 6 to 9, a multilayer ceramic capacitor 200 according to another embodiment of the present invention may include: a ceramic body 210 including a plurality of dielectric layers 211 and having first and second main surfaces 5 and 6 facing each other, first and second side surfaces 3 and 4 facing each other, and first and second end surfaces 1 and 2 facing each other; first, third, fifth, and seventh internal electrodes 221, 223, 225, and 227 that are exposed to the first side surface 3 in the ceramic body 210 and formed to be spaced apart from one another on a single layer in a cross-section of the ceramic body 210 in a length-width direction and second, fourth, sixth, and eighth internal electrodes 222, 224, 226, and 228 that are exposed to the second side surface 4 and formed to be spaced apart from one another on another single layer in the cross-section of the ceramic body 210 in the length-width direction; first to fourth internal connection conductors 241, 242, 243 and 244 that are formed in the ceramic body 210 and exposed to the first and second side surfaces 3 and 4; and first to eighth external electrodes 231, 232, 233, 234, 235, 236, 237, and 238 that are formed on the first and second side surfaces 3 and 4 of the ceramic body 210 and electrically connected to the first to eighth internal electrodes 221, 222, 223, 224, 225, 226, 227 and 228 and the first to fourth internal connection conductors 241, 242, 243 and 244, wherein the first and second internal electrodes 221 and 222, the third and fourth internal electrodes 223 and 224, the fifth and sixth internal electrodes 225 and 226, and the seventh and eighth internal electrodes 227 and 228 form first, second, third, and fourth capacitor parts, respectively, and the first to eighth internal electrodes 221, 222, 223, 224, 225, 226, 227 and 228 and the first to fourth internal connection conductors 241, 242, 243 and 244 are electrically connected to one another through the first to eighth external electrodes 231, 232, 233, 234, 235, 236, 237, and 238.

According to another embodiment of the present invention, the first to fourth external electrodes 231 to 234 may be disposed to be spaced apart from one another on the first side surface 3 of the ceramic body, and the fifth to eighth external electrodes 235 to 238 may be disposed to be spaced apart from one another on the second side surface 4 of the ceramic body.

According to another embodiment of the present invention, a mounting surface of the multilayer ceramic capacitor 200 may be the second side surface 4 of the ceramic body 210.

According to another embodiment of the present invention, the first, third, fifth, seventh, second, fourth, sixth, and eighth internal electrodes 221, 223, 225, 227, 222, 224, 226, and 228 may be sequentially connected to the first to eighth external electrodes 231, 232, 233, 234, 235, 236, 237, and 238, respectively.

According to another embodiment of the present invention, the first internal connection conductor 241 may be connected to the first internal electrode 221 through the first external electrode 231 and connected to the fourth internal electrode 224 through the sixth external electrode 236.

According to another embodiment of the present invention, the second internal connection conductor 242 may be connected to the second internal electrode 222 through the fifth external electrode 235 and connected to the third internal electrode 223 through the second external electrode 232.

According to another embodiment of the present invention, the third internal connection conductor 243 may be connected to the fifth internal electrode 225 through the third external electrode 233 and connected to the eighth internal electrode 228 through the eighth external electrode 238.

According to another embodiment of the present invention, the fourth internal connection conductor 244 may be connected to the sixth internal electrode 226 through the seventh external electrode 237 and connected to the seventh internal electrode 227 through the fourth external electrode 234.

According to another embodiment of the present invention, a fifth capacitor part may be connected to the first and sixth external electrodes 231 and 236.

According to another embodiment of the present invention, a sixth capacitor part may be connected to the third and eighth external electrodes 233 and 238.

In another embodiment of the present invention, as another example, in a length direction of the ceramic body 210, internal end portions of the first and fourth internal electrodes 221 and 224 in the length direction of the ceramic body 210, and internal end portions of the fifth and eighth internal electrodes 225 and 228 in the length direction thereof may coincide with each other when they are viewed in the stacking direction of the ceramic body.

The feature that the internal end portions of the internal electrodes coincide with each other is the same as the feature of the above-mentioned multilayer ceramic capacitor according to the embodiment of the present invention.

Referring to FIG. 9, the first and second internal connection conductors 241 and 242 and the third and fourth internal connection conductors 243 and 244 may be connected in parallel, respectively.

In addition, the first to fourth capacitor parts may be connected in parallel.

Further, the first capacitor part including the first and second internal electrodes 221 and 222 and the second capacitor part including the third and fourth internal electrodes 223 and 224 may be connected in series with the first and second internal connection conductors 241 and 242, respectively.

In addition, the third capacitor part including the fifth and sixth internal electrodes 225 and 226 and the fourth capacitor part including the seventh and eighth internal electrodes 227 and 228 may be connected in series with the third and fourth internal connection conductors 243 and 244, respectively.

Meanwhile, the fifth capacitor part may be connected in parallel with the first and second capacitor parts, and the sixth capacitor part may be connected in parallel with the third and fourth capacitor parts.

Since other features of the multilayer ceramic capacitor according to another embodiment of the present invention are the same as those of the above-mentioned multilayer ceramic capacitor according to the embodiment of the present invention, a detailed description thereof will be omitted.

The following Table 1 shows results obtained by comparing target ESR range ratios and values of ESL according to the lengths L1 and L2 of first and fourth internal electrodes and the length L3 of the third capacitor part corresponding to the overlap region in the length direction of the ceramic body between Inventive Examples and Comparative Examples.

As the Inventive Examples, multilayer ceramic capacitors were manufactured according to the embodiment of the present invention, and as the Comparative Examples, general multilayer ceramic capacitors were used.

More specifically, multilayer ceramic capacitors having a 1005 chip size (length×width is 1.0 mm×0.5 mm) and capacitance of 2.2 μF were used.

The target ESR range ratio may be a ratio of the measured ESR value to 200 mΩ±10%, an ESR range.

TABLE 1

| Sample | Ratio of length of overlap region to length of internal electrode (L3/L1 or L3/L2) | Target ESR Range Ratio | ESL (pH) |
|---|---|---|---|
| 1* | Not overlapped | 1 | 280 |
| 2 | coincidence | 1.1 | 232 |
| 3 | 0.001 | 1.6 | 185 |
| 4 | 0.005 | 2.1 | 182 |
| 5 | 0.01 | 1.8 | 181 |
| 6 | 0.02 | 1.0 | 181 |
| 7 | 0.05 | 1.0 | 195 |
| 8* | 0.10 | 0.5 | 245 |
| 9* | 0.20 | 0.1 | 320 |

*Comparative Example

Referring to Table 1, it may be appreciated that since the multilayer ceramic capacitor could have lower equivalent series inductance (ESL) in a high frequency band while maintaining high ESR in the cases of samples 2 to 7 corresponding to the Inventive Examples, in which the ratio of the measured ESR value to 200 mΩ±10%, an ESR range, was 1.0 or more, low impedance could be implemented in a wider frequency band in view of the overall impedance characteristics.

Particularly, in the cases of samples 2 to 5, since high frequency characteristics could be improved without decreasing an ESR region, low impedance could be more effectively implemented in a wider frequency band.

On the contrary, it may be appreciated that in the case of sample 1, which was the Comparative Example, since the overlap region was not present, ESL was increased, such that low impedance could not be implemented in a wider frequency band.

Further, it may be appreciated that in the cases of samples 8 and 9 corresponding to the Comparative Examples, in which the ratio of the measured ESR value to 200 mΩ±10%, an ESR range, was less than 1.0, the ESR region was decreased, and particularly, in sample 9, the ESL was increased, such that low impedance could not be implemented in the wider frequency band.

Mounting Board for a Multilayer Ceramic Capacitor

Figure 10:
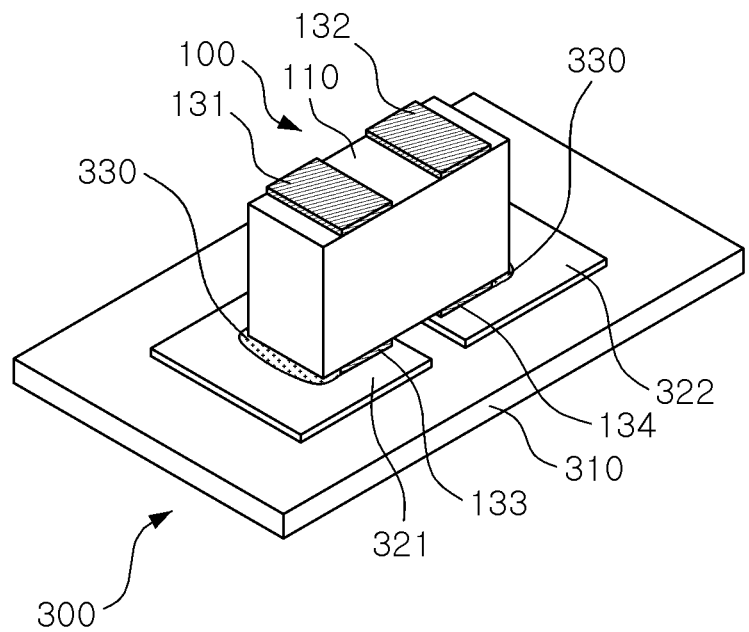
FIG. 10 is a perspective view showing a state in which the multilayer ceramic capacitor of FIG. 1 is mounted on a printed circuit board.

FIG. 10 is a perspective view showing a state in which the multilayer ceramic capacitor of FIG. 1 is mounted on a printed circuit board.

Referring to FIG. 10, a mounting board 300 for the multilayer ceramic capacitor 100 according to the embodiment of the present invention may include a printed circuit board 310 on which the multilayer ceramic capacitor 100 is mounted to be perpendicular thereto and first and second electrode pads 321 and 322 formed on the printed circuit board 310 to be spaced apart from each other.

In this case, the multilayer ceramic capacitor 100 may be electrically connected to the printed circuit board 310 by a soldering 330 while third and fourth external electrodes 133 and 134 are positioned on the first and second electrode pads 321 and 322 so as to contact each other, respectively.

Except for the description described above, a description of features overlapped with those of the above-mentioned multilayer ceramic capacitor according to the embodiment of the present invention will be omitted.

Figure 11:
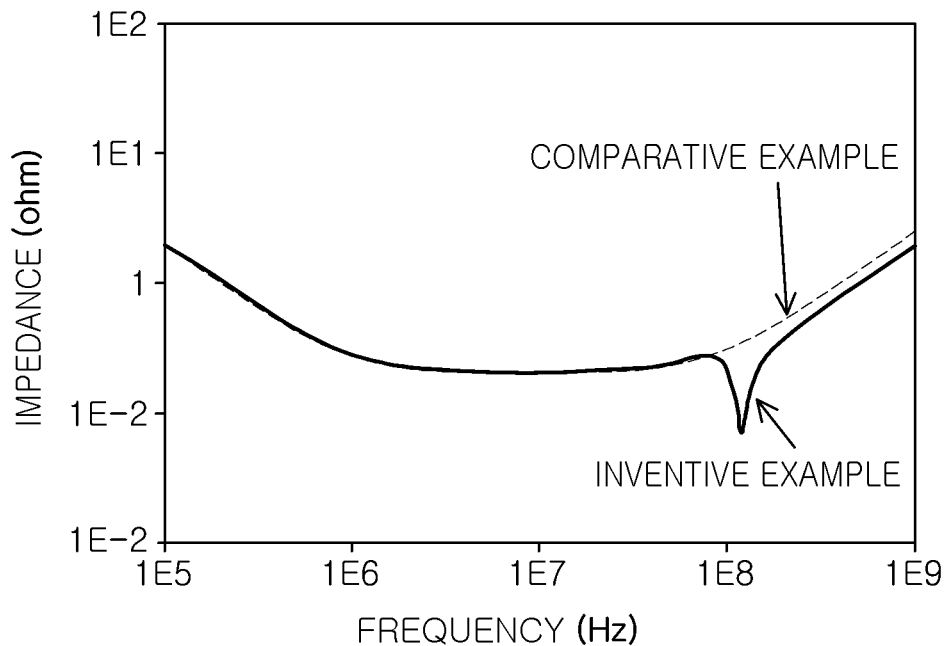
FIG. 11 is a graph comparing Inventive Example and Comparative Example of the present invention, in view of impedance.

FIG. 11 is a graph comparing Inventive Example and Comparative Example of the present invention, in view of impedance.

Figure 12:
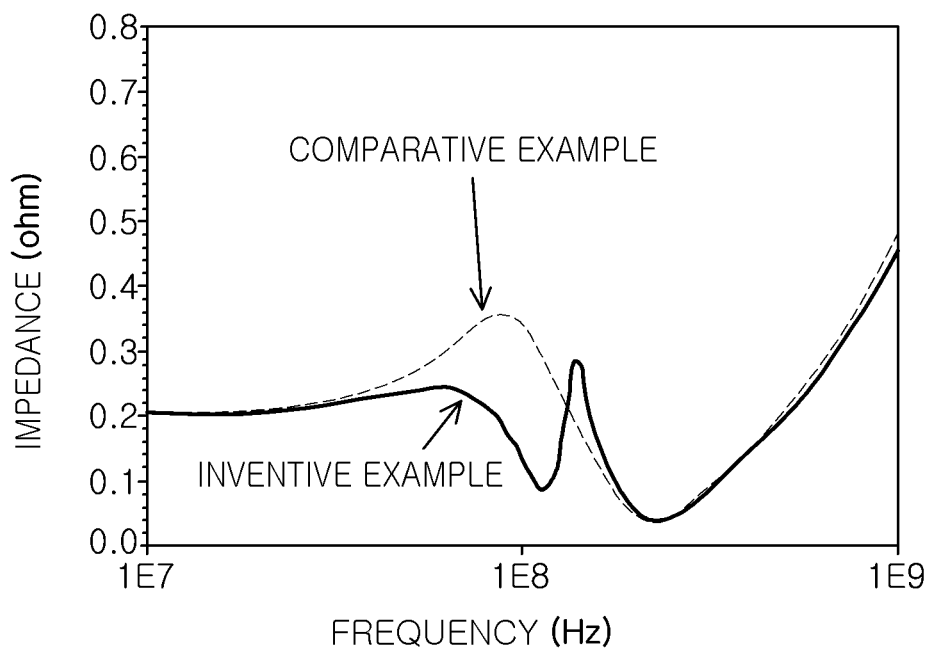
FIG. 12 is a graph comparing Inventive Example and Comparative Example of the present invention, in view of impedance, in a large scale integrated circuit (LSI) power supply.

FIG. 12 is a graph comparing Inventive Example and Comparative Example of the present invention, in view of impedance, in a large scale integrated circuit (LSI) power supply.

Referring to FIGS. 11 and 12, it may be appreciated that in the multilayer ceramic capacitor according to the embodiment of the present invention, impedance was decreased in a wider frequency band, as compared with the case of Comparative Example, a multilayer ceramic capacitor according to the related art.

As set forth above, according to the embodiment of the present invention, the multilayer ceramic capacitor having two types of resistors and three types of capacitor parts and controlling values thereof can be provided.

Therefore, a reduction in impedance and a control thereof can be facilitated within a relatively large frequency band, as compared to the case of a multilayer ceramic capacitor according to the related art, and an available mounting space and manufacturing costs can be reduced due to a decrease in components.

In addition, as the capacitor is perpendicularly mounted with respect to a mounting board, the downsizing of a product may not be hindered by non-contact terminals, which may be advantageous for miniaturization of the product.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
a ceramic body including a plurality of dielectric layers and having first and second main surfaces facing each other, first and second side surfaces facing each other, and first and second end surfaces facing each other;
a first capacitor part formed in the ceramic body and including a first internal electrode having a lead portion exposed to the first side surface and a second internal electrode having a lead portion exposed to the second side surface, a second capacitor part including a third internal electrode having a lead portion exposed to the first side surface and spaced apart from the lead portion of the first internal electrode and a fourth internal electrode having a lead portion exposed to the second side surface and spaced apart from the lead portion of the second internal electrode, and a third capacitor part formed by an overlap region between the first and fourth internal electrodes;
first and second internal connection conductors formed in the ceramic body and exposed to the first and second side surfaces; and
first to fourth external electrodes formed on the first and second side surfaces of the ceramic body and electrically connected to the first to fourth internal electrodes and the first and second internal connection conductors,
wherein the first capacitor part is connected in series with the second internal connection conductor, and the second capacitor part is connected in series with the first internal connection conductor.

2. The multilayer ceramic capacitor of claim 1, wherein the first and second external electrodes are disposed to be spaced apart from each other on the first side surface of the ceramic body, and the third and fourth external electrodes are disposed to be spaced apart from each other on the second side surface of the ceramic body.

3. The multilayer ceramic capacitor of claim 1, wherein a mounting surface of the multilayer ceramic capacitor is the second side surface of the ceramic body.

4. The multilayer ceramic capacitor of claim 1, wherein the lead portion of the first internal electrode is connected to the first external electrode, the lead portion of the second internal electrode is connected to the third external electrode, the lead portion of the third internal electrode is connected to the second external electrode, and the lead portion of the fourth internal electrode is connected to the fourth external electrode.

5. The multilayer ceramic capacitor of claim 4, wherein the first internal connection conductor is connected to the second internal electrode through the third external electrode and connected to the third internal electrode through the second external electrode.

6. The multilayer ceramic capacitor of claim 4, wherein the second internal connection conductor is connected to the first internal electrode through the first external electrode and connected to the fourth internal electrode through the fourth external electrode.

7. The multilayer ceramic capacitor of claim 1, wherein the first and third internal electrodes are formed to be spaced apart from each other on a single layer in a cross-section of the ceramic body in a length-width direction, and the second and fourth internal electrodes are formed to be spaced apart from each other on another single layer in the cross-section of the ceramic body in the length-width direction.

8. The multilayer ceramic capacitor of claim 1, wherein the third capacitor part is connected to the first and fourth external electrodes.

9. The multilayer ceramic capacitor of claim 1, wherein when lengths of the first and fourth internal electrodes in a length direction of the ceramic body are defined by L1 and L2, respectively, and a length of the third capacitor part corresponding to the overlap region is defined by L3, $L3/L1 \leq 0.05$ or $L3/L2 \leq 0.05$ is satisfied.

10. The multilayer ceramic capacitor of claim 1, wherein when lengths of the first and fourth internal electrodes in a length direction of the ceramic body are defined by L1 and L2, respectively, and a length of the third capacitor part corresponding to the overlap region is defined by L3, $0.001 \leq L3/L1 \leq 0.01$ or $0.001 \leq L3/L2 \leq 0.01$ is satisfied.

11. The multilayer ceramic capacitor of claim 1, wherein internal end portions of the first and fourth internal electrodes in a length direction of the ceramic body coincide with each other when they are viewed in a stacking direction of the ceramic body.

12. A mounting board for a multilayer ceramic capacitor, comprising:
a printed circuit board having first and second electrode pads thereon; and
the multilayer ceramic capacitor of claim 1 mounted on the printed circuit board.

13. A multilayer ceramic capacitor comprising:
a ceramic body including a plurality of dielectric layers and having first and second main surfaces facing each other, first and second side surfaces facing each other, and first and second end surfaces facing each other;
first, third, fifth, and seventh internal electrodes exposed to the first side surface in the ceramic body and formed to be spaced apart from one another on a single layer and second, fourth, sixth, and eighth internal electrodes exposed to the second side surface and formed to be spaced apart from one another on another single layer, in a cross-section of the ceramic body in a length-width direction;
first to fourth internal connection conductors formed in the ceramic body and exposed to the first and second side surfaces; and
first to eighth external electrodes formed on the first and second side surfaces of the ceramic body and electrically connected to the first to eighth internal electrodes and the first to fourth internal connection conductors,
wherein the first and second internal electrodes, the third and fourth internal electrodes, the fifth and sixth internal electrodes, and the seventh and eighth internal electrodes form first, second, third, and fourth capacitor parts, respectively, a fifth capacitor part is formed by an overlap region between the first and fourth internal electrode, and a sixth capacitor part is formed by an overlapped portion between the fifth and eighth internal electrodes, the first and second capacitor parts being connected in series with the first and second internal connection conductors, respectively, and the third and fourth capacitor parts being connected in series with the third and fourth internal connection conductors, respectively.

14. The multilayer ceramic capacitor of claim 13, wherein the first to fourth external electrodes are disposed to be spaced apart from one another on the first side surface of the ceramic body, and the fifth to eighth external electrodes are disposed to be spaced apart from one another on the second side surface of the ceramic body.

15. The multilayer ceramic capacitor of claim 13, wherein a mounting surface of the multilayer ceramic capacitor is the second side surface of the ceramic body.

16. The multilayer ceramic capacitor of claim 13, wherein the first, third, fifth, seventh, second, fourth, sixth, and eighth internal electrodes are connected to the first to eighth external electrodes, respectively.

17. The multilayer ceramic capacitor of claim 13, wherein the first internal connection conductor is connected to the first internal electrode through the first external electrode and connected to the fourth internal electrode through the sixth external electrode.

18. The multilayer ceramic capacitor of claim 13, wherein the second internal connection conductor is connected to the second internal electrode through the fifth external electrode and connected to the third internal electrode through the second external electrode.

19. The multilayer ceramic capacitor of claim 13, wherein the third internal connection conductor is connected to the fifth internal electrode through the third external electrode and connected to the eighth internal electrode through the eighth external electrode.

20. The multilayer ceramic capacitor of claim 13, wherein the fourth internal connection conductor is connected to the sixth internal electrode through the seventh external electrode and connected to the seventh internal electrode through the fourth external electrode.

21. The multilayer ceramic capacitor of claim 13, wherein the fifth capacitor part is connected to the first and sixth external electrodes.

22. The multilayer ceramic capacitor of claim 13, wherein the sixth capacitor part is connected to the third and eighth external electrodes.

23. The multilayer ceramic capacitor of claim 13, wherein internal end portions of the first and fourth internal electrodes in a length direction of the ceramic body, and internal end portions of the fifth and eighth internal electrodes in the length direction of the ceramic body coincide with each other, respectively, when they are viewed in a stacking direction of the ceramic body.

\* \* \* \* \*